United States Patent
Murphy et al.

(10) Patent No.: US 8,906,724 B2
(45) Date of Patent: Dec. 9, 2014

(54) COLOR STABLE RED-EMITTING PHOSPHORS

(71) Applicant: General Electric Company, Schenectady, NY (US)

(72) Inventors: James Edward Murphy, Niskayuna, NY (US); Anant Achyut Setlur, Niskayuna, NY (US); Florencio Garcia, Schenectady, NY (US); Robert Joseph Lyons, Burnt Hills, NY (US); Ashfaqul Islam Chowdhury, Broadview Heights, OH (US); Nagaveni Karkada, Bangalore (IN); Prasanth Kumar Nammalwar, Bangalore (IN)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/311,624

(22) Filed: Jun. 23, 2014

(65) Prior Publication Data
US 2014/0327026 A1    Nov. 6, 2014

Related U.S. Application Data

(63) Continuation of application No. PCT/US2014/027733, filed on Mar. 14, 2014.

(60) Provisional application No. 61/791,511, filed on Mar. 15, 2013.

(51) Int. Cl.
*H01L 21/00* (2006.01)
*H01L 33/50* (2010.01)
*H01L 33/52* (2010.01)
*C09K 11/61* (2006.01)

(52) U.S. Cl.
CPC .............. *H01L 33/502* (2013.01); *H01L 33/52* (2013.01); *C09K 11/616* (2013.01); *C09K 2211/181* (2013.01); *C09K 2211/188* (2013.01)
USPC .......................................................... 438/34

(58) Field of Classification Search
CPC ....... H01L 33/50; H01L 33/502; H01L 33/52; C09K 11/616; C09K 2211/181; C09K 2211/188
USPC ................................... 438/22, 34, 35; 257/98
See application file for complete search history.

(56) References Cited

U.S. PATENT DOCUMENTS

| 2,522,074 A | 9/1950 | Urbach |
| 3,576,756 A | 4/1971 | Russo |

(Continued)

FOREIGN PATENT DOCUMENTS

| CN | 102827601 A | 12/2012 |
| CN | 102851026 A | 1/2013 |

(Continued)

OTHER PUBLICATIONS

Frayret et al., "Solubility of (NH4)2SiF6, K2SiF6 and Na2SiF6 in acidic solutions", Chemical Physics Letters, Aug. 2006, pp. 356-364, vol. 427, Issue 4.

(Continued)

*Primary Examiner* — Colleen A Matthews
*Assistant Examiner* — Quovaunda V Jefferson
(74) *Attorney, Agent, or Firm* — Mary Louise Stanford

(57) ABSTRACT

A process for synthesizing a color stable $Mn^{4+}$ doped phosphor includes contacting a precursor of formula I, in gaseous form at an elevated temperature with a fluorine-containing oxidizing agent to form the color stable $Mn^{4+}$ doped phosphor $$A_x[MF_y]:Mn^{4+} \qquad \text{I}$$

wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is the absolute value of the charge of the $[MF_y]$ ion; and
y is 5, 6 or 7.

29 Claims, 3 Drawing Sheets

(56) References Cited

U.S. PATENT DOCUMENTS

| | | | |
|---|---|---|---|
| 4,479,886 | A | 10/1984 | Kasenga |
| 6,103,296 | A | 8/2000 | McSweeney |
| 7,270,773 | B2 | 9/2007 | Manivannan et al. |
| 7,358,542 | B2 | 4/2008 | Radkov et al. |
| 7,422,703 | B2 | 9/2008 | Yi et al. |
| 7,497,973 | B2 | 3/2009 | Radkov et al. |
| 7,648,649 | B2 | 1/2010 | Radkov et al. |
| 7,847,309 | B2 | 12/2010 | Radkov et al. |
| 8,057,706 | B1 | 11/2011 | Setlur et al. |
| 8,252,613 | B1* | 8/2012 | Lyons et al. ............ 438/46 |
| 8,362,685 | B2 | 1/2013 | Masuda et al. |
| 8,427,042 | B2 | 4/2013 | Hata et al. |
| 8,491,816 | B2 | 7/2013 | Hong et al. |
| 8,497,623 | B2 | 7/2013 | Oguma et al. |
| 8,593,062 | B2 | 11/2013 | Murphy et al. |
| 8,703,016 | B2 | 4/2014 | Nammalwar et al. |
| 8,710,487 | B2 | 4/2014 | Lyons et al. |
| 2006/0003466 | A1* | 1/2006 | Yi et al. ............ 436/526 |
| 2009/0001869 | A1 | 1/2009 | Tanimoto et al. |
| 2010/0090585 | A1 | 4/2010 | Seto et al. |
| 2010/0091215 | A1 | 4/2010 | Fukunaga et al. |
| 2010/0142189 | A1* | 6/2010 | Hong et al. ............ 362/97.3 |
| 2011/0069490 | A1 | 3/2011 | Liu |
| 2012/0256125 | A1 | 10/2012 | Kaneyoshi et al. |
| 2013/0241396 | A1 | 9/2013 | Hiramatsu et al. |
| 2013/0264937 | A1 | 10/2013 | Sakuta et al. |
| 2013/0271960 | A1 | 10/2013 | Hong et al. |

FOREIGN PATENT DOCUMENTS

| | | |
|---|---|---|
| EP | 1807354 B1 | 11/2008 |
| GB | 1360690 A | 7/1974 |
| JP | 2013-014715 A | 1/2013 |
| JP | 2013-060506 A | 4/2013 |
| WO | 2009005035 A1 | 1/2009 |
| WO | 2009119486 A1 | 10/2009 |
| WO | 2011073951 A2 | 6/2011 |
| WO | 2013088313 A1 | 6/2013 |
| WO | 2013121355 A1 | 8/2013 |
| WO | 2013138347 A1 | 9/2013 |
| WO | 2013144919 A1 | 10/2013 |
| WO | 2013158929 A1 | 10/2013 |
| WO | 2014068440 A1 | 5/2014 |

OTHER PUBLICATIONS

Paulusz, "Efficient Mn(IV) Emission in Fluorine Coordination", Journal of the Electrochemical Society, Jul. 1973, pp. 942-947, vol. 120, Issue 7.

Liao et al.,"Synthesis of K2SiF6:Mn4+ Phosphor from SiO2 Powders via Redox Reaction in HF/KMnO4 Solution and Their Application in Warm-White LED", Journal of the American Ceramic Society, Wiley online library, Nov. 2013, vol. 96, Issue 11, pp. 3552-3556.

Hu et al., "Preparation and luminescent properties of (Ca1-x,Srx)S:Eu2+ red-emitting phosphor for white LED", Journal of Luminescence, ScienceDirect, Feb. 1, 2005,vol. 111, Issue 3, pp. 139-145.

Kasa et al.,"Red and Deep Red Emissions from Cubic K2SiF6:Mn4+ and Hexagonal K2MnF6 Synthesized in HF/KMnO4/KHF2/Si Solutions", Journal of the Electrochemical Society, ECS, 2012, vol. 159, issue 4, J89-J95.

Nammalwar et al., "Phosphor Materials and Related Devices", U.S. Appl. No. 14/348,244, filed Mar. 28, 2014.

Murphy et al., "Method and System for Storage of Perishable Items", U.S. Appl. No. 13/665,514, filed Oct. 31, 2012.

Brewster et al., "Phosphor Assembly for Light Emitting Devices", U.S. Appl. No. 13/875,534, filed May 2, 2013.

Murphy, "Processes for Preparing Color Stable Manganese-Doped Phosphors", U.S. Appl. No. 61/868,633, filed Aug. 22, 2013.

Setlur et al., "LED Package With Red-Emitting Phosphors", U.S. Appl. No. 14/073,141, filed Nov. 6, 2013.

Murphy et al., "Processes for Preparing Color Stable Manganese-Doped Complex Fluoride Phosphors", U.S. Appl. No. 61/915,927, filed Dec. 13, 2013.

Bera et al., "Optimization of the Yellow Phosphor Concentration and Layer Thickness for Down-Conversion of Blue to White Light", Journal of Display Technology, pp. 645-651, vol. 6, No. 12, Dec. 2010.

Murphy et al., "Red-Emtting Phosphors and Associated Devices", U.S. Appl. No. 14/303,020, filed Jun. 12, 2014.

Setlur et al., "Color Stable Red-Emitting Phosphors", U.S. Appl. No. 14/302,823, filed Jun. 12, 2014.

Setlur et al., "LED Package With Red-Emitting Phosphors", U.S. Appl. No. 14/304,098, filed Jun. 13, 2014.

Garcia et al., "Color Stable Red-Emitting Phosphors", U.S. Appl. No. 14/302,907, filed Jun. 12, 2014.

Takahashi et al., "Mn4+-Activated Red Photoluminescence in K2SiF6 Phosphor", Journal of the Electrochemical Society, pp. E183-E188, vol. 155, Issue 12, 2008.

International Search Report and Written Opinion dated Jul. 14, 2014 which was issued in connection with PCT Patent Application No. PCT/US2014/027733.

* cited by examiner

COLOR STABLE RED-EMITTING PHOSPHORS

CROSS-REFERENCE TO RELATED APPLICATIONS

This application is a continuation of International Application No. PCT/US2014/027733, with an international filing date of Mar. 14, 2014, and is related to U.S. application Ser. No. 14/208,592, filed on Mar. 13, 2014, and U.S. application Ser. No. 14/285,746, filed on May 23, 2014, all of which claim the benefit of U.S. Provisional Application No. 61/791,511, filed on Mar. 15, 2013, the entire disclosures of which are incorporated herein by reference.

BACKGROUND

Red-emitting phosphors based on complex fluoride materials activated by $Mn^{4+}$, such as those described in U.S. Pat. No. 7,358,542, U.S. Pat. No. 7,497,973, and U.S. Pat. No. 7,648,649, can be utilized in combination with yellow/green emitting phosphors such as YAG:Ce or other garnet compositions to achieve warm white light (CCTs<5000 K on the blackbody locus, color rendering index (CRI) >80) from a blue LED, equivalent to that produced by current fluorescent, incandescent and halogen lamps. These materials absorb blue light strongly and efficiently emit between about 610-635 nm with little deep red/NIR emission. Therefore, luminous efficacy is maximized compared to red phosphors that have significant emission in the deeper red where eye sensitivity is poor. Quantum efficiency can exceed 85% under blue (440-460 nm) excitation.

While the efficacy and CRI of lighting systems using $Mn^{4+}$ doped fluoride hosts can be quite high, one potential limitation is their susceptibility to degradation under high temperature and humidity (HTHH) conditions. It is possible to reduce this degradation using post-synthesis processing steps, as described in U.S. Pat. No. 8,252,613. However, further improvement in stability of the materials is desirable.

BRIEF DESCRIPTION

Briefly, in one aspect, the present invention relates to a process for synthesizing a color stable $Mn^{4+}$ doped phosphor. A precursor of formula I is contacted with a fluorine-containing oxidizing agent in gaseous form at an elevated temperature to form the color stable $Mn^{4+}$ doped phosphor

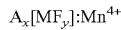

$$A_x[MF_y]:Mn^{4+} \qquad I$$

wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is the absolute value of the charge of the [$MF_y$] ion; and
y is 5, 6 or 7.

In another aspect, the present invention relates to color stable $Mn^{4+}$ doped phosphors that may be produced by the process.

In yet another aspect, the present invention relates to backlight devices and lighting apparatuses with color stability, and containing $Mn^{4+}$ doped phosphors.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
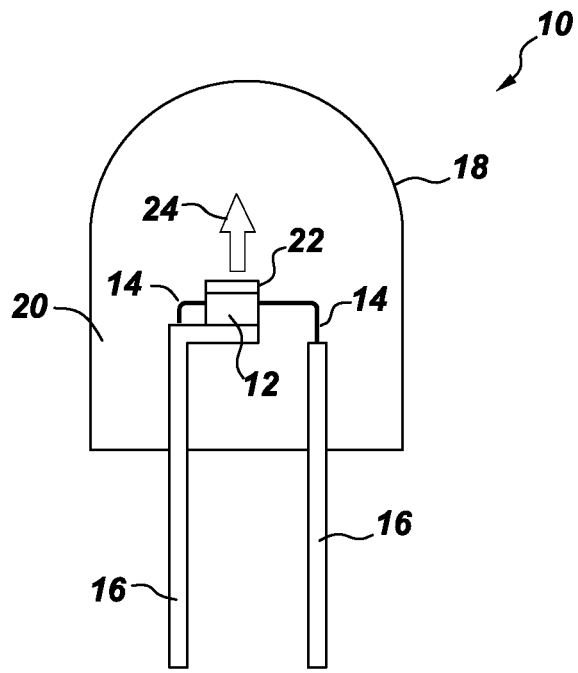
FIG. 1 is a schematic cross-sectional view of a lighting apparatus in accordance with one embodiment of the invention.

In the processes according to the present invention, a non-color stable precursor to a color stable phosphor is annealed, or subjected to an elevated temperature, while in contact with an atmosphere containing a fluorine-containing oxidizing agent. The precursor is a complex fluoride material activated by $Mn^{4+}$ of formula I. In the context of the present invention, the term "complex fluoride material or phosphor", means a coordination compound, containing at least one coordination center, surrounded by fluoride ions acting as ligands, and charge-compensated by counter ions as necessary. In one example, $K_2SiF_6:Mn^{4+}$, the coordination center is Si and the counterion is K. Complex fluorides are occasionally written down as a combination of simple, binary fluorides but such a representation does not indicate the coordination number for the ligands around the coordination center. The square brackets (occasionally omitted for simplicity) indicate that the complex ion they encompass is a new chemical species, different from the simple fluoride ion. The activator ion ($Mn^{4+}$) also acts as a coordination center, substituting part of the centers of the host lattice, for example, Si. The host lattice (including the counter ions) may further modify the excitation and emission properties of the activator ion.

The non-color stable precursor has a nominal composition similar to the color stable phosphor but lacks the color stability of the final product. The amount of manganese in the $Mn^{4+}$ doped precursors of formula I and in the color stable phosphors ranges from about 0.3 weight % to about 1.5 weight %, based on total weight of the precursor or color stable phosphor. $K_2SiF_6:Mn^{4+}$ containing about 0.5 wt % Mn, before and after annealing, is typically more color stable under high light flux conditions than $K_2SiF_6:Mn^{4+}$ containing about 0.68 wt % Mn, before and after annealing. For $K_2SiF_6:Mn^{4+}$, the amount of Mn ranges from about 0.50 wt % to about 0.85 wt %, more particularly from about 0.65 wt % to about 0.75 wt %.

In particular embodiments, the coordination center of the precursor, that is, M in formula I, is Si, Ge, Sn, Ti, Zr, or a combination thereof. More particularly, the coordination center is Si, Ge, Ti, or a combination thereof, and the counterion, or A in formula I, is Na, K, Rb, Cs, or a combination thereof, and y is 6. Examples of precursors of formula I include $K_2[SiF_6]:Mn^{4+}$, $K_2[TiF_6]:Mn^{4+}$, $K_2[SnF_6]:Mn^{4+}$, $Cs_2[TiF_6]$, $Rb_2[TiF_6]$, $Cs_2[SiF_6]$, $Rb_2[SiF_6]$, $Na_2[TiF_6]:Mn^{4+}$, $Na_2[ZrF_6]:Mn^{4+}$, $K_3[ZrF_7]:Mn^{4+}$, $K_3[BiF_6]:Mn^{4+}$, $K_3[YF_6]:Mn^{4+}$, $K_3[LaF_6]:Mn^{4+}$, $K_3[GdF_6]:Mn^{4+}$, $K_3[NbF_7]:Mn^{4+}$, $K_3[TaF_7]:Mn^{4+}$. In particular embodiments, the precursor of formula I is $K_2SiF_6:Mn^{4+}$.

Although the inventors do not wish to be held to any particular theory to explain the improvement in color stability that can result from subjecting the precursor to a process according to the present invention, it is postulated that the precursor may contain defects such as dislocations, $F^-$ vacancies, cation vacancies, $Mn^{3+}$ ions, $Mn^{2+}$ ions, $OH^-$ replacement of $F^-$, or surface or interstitial $H^+/OH^-$ groups that provide non-radiative recombination pathways, and these are healed or removed by exposure to the oxidizing agent at elevated temperature.

The temperature at which the precursor is contacted with the fluorine-containing oxidizing agent may range from about 200° C. to about 700° C., particularly from about 350° C. to about 600° C. during contact, and in some embodiments from about 200° C. to about 700° C. In various embodiments of the present invention, the temperature is at least 100° C., particularly at least 225° C., and more particularly at least 350° C. The phosphor precursor is contacted with the oxidizing agent for a period of time sufficient to convert it to a color stable phosphor. Time and temperature are interrelated, and may be adjusted together, for example, increasing time while reducing temperature, or increasing temperature while reducing time. In particular embodiments, the time is at least one hour, particularly for at least four hours, more particularly at least six hours, and most particularly at least eight hours. In a specific embodiment, the precursor is contacted with the oxidizing agent for a period of at least eight hours and a temperature of at least 250° C., for example, at about 250° C. for about four hours and then at a temperature of about 350° C. for about four hours.

The fluorine-containing oxidizing agent may be $F_2$, HF, $SF_6$, $BrF_5$, $NH_4HF_2$, $NH_4F$, KF, $AlF_3$, $SbF_5$, $ClF_3$, $BrF_3$, KrF, $XeF_2$, $XeF_4$, $NF_3$, $SiF_4$, $PbF_2$, $ZnF_2$, $SnF_2$, $CdF_2$ or a combination thereof. In particular embodiments, the fluorine-containing oxidizing agent is $F_2$. The amount of oxidizing agent in the atmosphere may be varied to obtain the color stable phosphor, particularly in conjunction with variation of time and temperature. Where the fluorine-containing oxidizing agent is $F_2$, the atmosphere may include at least 0.5% $F_2$, although a lower concentration may be effective in some embodiments. In particular the atmosphere may include at least 5% $F_2$ and more particularly at least 20% $F_2$. The atmosphere may additionally include nitrogen, helium, neon, argon, krypton, xenon, in any combination with the fluorine-containing oxidizing agent. In particular embodiments, the atmosphere is composed of about 20% $F_2$ and about 80% nitrogen.

The manner of contacting the precursor with the fluorine-containing oxidizing agent is not critical and may be accomplished in any way sufficient to convert the precursor to a color stable phosphor having the desired properties. In some embodiments, the chamber containing the precursor may be dosed and then sealed such that an overpressure develops as the chamber is heated, and in others, the fluorine and nitrogen mixture is flowed throughout the anneal process ensuring a more uniform pressure. In some embodiments, an additional dose of the fluorine-containing oxidizing agent may be introduced after a period of time.

In another aspect, the present invention relates to a process for synthesizing a color stable $Mn^{4+}$ doped phosphor, the process comprising contacting a precursor at an elevated temperature with a fluorine-containing oxidizing agent in gaseous form to form the color stable $Mn^{4+}$ doped phosphor, wherein the precursor is selected from the group consisting of (A) $A_2[MF_5]:Mn^{4+}$, where A is selected from Li, Na, K, Rb, Cs, and combinations thereof; and where M is selected from Al, Ga, In, and combinations thereof;

(B) $A_3[MF_6]:Mn^{4+}$, where A is selected from Li, Na, K, Rb, Cs, and combinations thereof; and where M is selected from Al, Ga, In, and combinations thereof;

(C) $Zn_2[MF_7]:Mn^{4+}$, where M is selected from Al, Ga, In, and combinations thereof;

(D) $A[In_2F_7]:Mn^{4+}$ where A is selected from Li, Na, K, Rb, Cs, and combinations thereof;

(E) $A_2[MF_6]:Mn^{4+}$, where A is selected from Li, Na, K, Rb, Cs, and combinations thereof; and where M is selected from Ge, Si, Sn, Ti, Zr, and combinations thereof;

(F) $E[MF_6]:Mn^{4+}$, where E is selected from Mg, Ca, Sr, Ba, Zn, and combinations thereof; and where M is selected from Ge, Si, Sn, Ti, Zr, and combinations thereof;

(G) $Ba_{0.65}Zr_{0.35}F_{2.70}:Mn^{4+}$; and (H) $A_3[ZrF_7]:Mn^{4+}$ where A is selected from Li, Na, K, Rb, Cs, $NH_4$; and (I) combinations thereof.

Time, temperature and fluorine-containing oxidizing agents for the process are as described above.

Color stability and quantum efficiency of phosphors annealed in a process according to the present invention may be enhanced by treating the phosphor in particulate form with a saturated solution of a composition of formula II $$A_x[MF_y] \qquad \qquad \text{II}$$

in aqueous hydrofluoric acid, as described in U.S. Pat. No. 8,252,613. The temperature at which the phosphor is contacted with the solution ranges from about 20° C. to about 50° C. The period of time required to produce the color stable phosphor ranges from about one minute to about five hours, particularly from about five minutes to about one hour. Concentration of hydrofluoric acid in the aqueous HF solutions ranges from about 20% w/w to about 70% w/w, particularly about 40% w/w to about 70% w/w. Less concentrated solutions may result in lower yields of the phosphor.

A lighting apparatus or light emitting assembly or lamp 10 according to one embodiment of the present invention is shown in FIG. 1. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self supported electrodes and the lead frame may be omitted. The leads 14 provide current to LED chip 12 and thus cause it to emit radiation.

The lamp may include any semiconductor blue or UV light source that is capable of producing white light when its emitted radiation is directed onto the phosphor. In one embodiment, the semiconductor light source is a blue emitting LED doped with various impurities. Thus, the LED may comprise a semiconductor diode based on any suitable III-V, II-VI or IV-IV semiconductor layers and having an emission wavelength of about 250 to 550 nm. In particular, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and $I+j+k=1$) having an emission wavelength greater than about 250 nm and less than about 550 nm. In particular embodiments, the chip is a near-uv or blue emitting LED having a peak emission wavelength from about 400 to about 500 nm. Such LED semiconductors are known in the art. The radiation source is described herein as an LED for convenience. However, as used herein, the term is meant to encompass all semiconductor radiation sources including, e.g., semiconductor laser diodes. Further, although the general discussion of the exemplary structures of the invention discussed herein is directed toward inorganic LED based light sources, it should be understood that the LED chip may be replaced by another radiation source unless otherwise noted and that any reference to semiconductor, semiconductor LED, or LED chip is merely representative of any appropriate radiation source, including, but not limited to, organic light emitting diodes.

In lighting apparatus 10, phosphor composition 22 is radiationally coupled to the LED chip 12. Radiationally coupled means that the elements are associated with each other so radiation from one is transmitted to the other. Phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of phosphor composition 22 and LED 12. Thus, phosphor composition 22 may be coated over or directly on the light emitting surface of the LED chip 12 by coating and drying the phosphor suspension over the LED chip 12. In the case of a silicone-based suspension, the suspension is cured at an appropriate temperature. Both the shell 18 and the encapsulant 20 should be transparent to allow white light 24 to be transmitted through those elements. Although not intended to be limiting, in some embodiments, the median particle size of the phosphor composition ranges from about 1 to about 50 microns, particularly from about 15 to about 35 microns.

In other embodiments, phosphor composition 22 is interspersed within the encapsulant material 20, instead of being formed directly on the LED chip 12. The phosphor (in the form of a powder) may be interspersed within a single region of the encapsulant material 20 or throughout the entire volume of the encapsulant material. Blue light emitted by the LED chip 12 mixes with the light emitted by phosphor composition 22, and the mixed light appears as white light. If the phosphor is to be interspersed within the material of encapsulant 20, then a phosphor powder may be added to a polymer or silicone precursor, loaded around the LED chip 12, and then the polymer precursor may be cured to solidify the polymer or silicone material. Other known phosphor interspersion methods may also be used, such as transfer loading.

In some embodiments, the encapsulant material 20 is a silicone matrix having an index of refraction R, and, in addition to phosphor composition 22, contains a diluent material having less than about 5% absorbance and index of refraction of R±0.1. The diluent material has an index of refraction of ≤1.7, particularly ≤1.6, and more particularly ≤1.5. In particular embodiments, the diluent material is of formula II, and has an index of refraction of about 1.4. Adding an optically inactive material to the phosphor/silicone mixture may produce a more gradual distribution of light flux through the phosphor/encapsulant mixture and can result in less damage to the phosphor. Suitable materials for the diluent include fluoride compounds such as LiF, $MgF_2$, $CaF_2$, $SrF_2$, $AlF_3$, $K_2NaAlF_6$, $KMgF_3$, $CaLiAlF_6$, $K_2LiAlF_6$, and $K_2SiF_6$, which have index of refraction ranging from about 1.38 ($AlF_3$ and $K_2NaAlF_6$) to about 1.43 ($CaF_2$), and polymers having index of refraction ranging from about 1.254 to about 1.7. Non-limiting examples of polymers suitable for use as a diluent include polycarbonates, polyesters, nylons, polyetherimides, polyetherketones, and polymers derived from styrene, acrylate, methacrylate, vinyl, vinyl acetate, ethylene, propylene oxide, and ethylene oxide monomers, and copolymers thereof, including halogenated and unhalogenated derivatives. These polymer powders can be directly incorporated into silicone encapsulants before silicone curing.

In yet another embodiment, phosphor composition 22 is coated onto a surface of the shell 18, instead of being formed over the LED chip 12. The phosphor composition is preferably coated on the inside surface of the shell 18, although the phosphor may be coated on the outside surface of the shell, if desired. Phosphor composition 22 may be coated on the entire surface of the shell or only a top portion of the surface of the shell. The UV/blue light emitted by the LED chip 12 mixes with the light emitted by phosphor composition 22, and the mixed light appears as white light. Of course, the phosphor may be located in any two or all three locations or in any other suitable location, such as separately from the shell or integrated into the LED.

Figure 2:
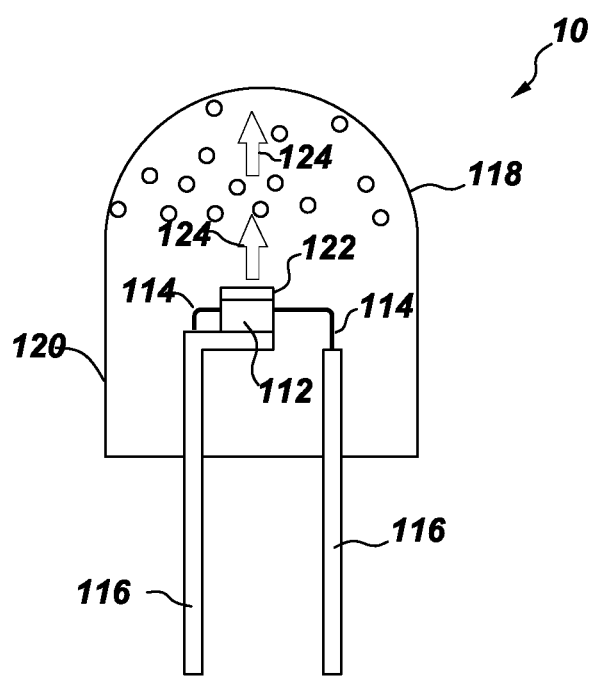
FIG. 2 is a schematic cross-sectional view of a lighting apparatus in accordance with another embodiment of the invention.

FIG. 2 illustrates a second structure of the system according to the present invention. Corresponding numbers from FIGS. 1-4 (e.g. 12 in FIGS. 1 and 112 in FIG. 2) relate to corresponding structures in each of the figures, unless otherwise stated. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material or throughout the entire volume of the encapsulant material. Radiation (indicated by arrow 126) emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer or silicone precursor may then be cured to solidify the polymer or silicone. Other known phosphor interspersion methods may also be used, such as transfer molding.

Figure 3:
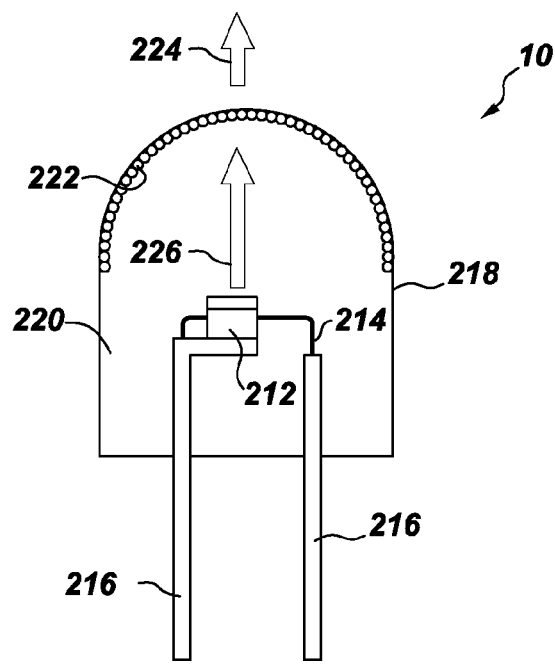
FIG. 3 is a schematic cross-sectional view of a lighting apparatus in accordance with yet another embodiment of the invention.

FIG. 3 illustrates a third possible structure of the system according to the present invention. The structure of the embodiment shown in FIG. 3 is similar to that of FIG. 1, except that the phosphor composition 222 is coated onto a surface of the envelope 218, instead of being formed over the LED chip 212. The phosphor composition 222 is preferably coated on the inside surface of the envelope 218, although the phosphor may be coated on the outside surface of the envelope, if desired. The phosphor composition 222 may be coated on the entire surface of the envelope, or only a top portion of the surface of the envelope. The radiation 226 emitted by the LED chip 212 mixes with the light emitted by the phosphor composition 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp may also include a plurality of scattering particles (not shown), which are embedded in the encapsulant material. The scattering particles may comprise, for example, alumina or titania. The scattering particles effectively scatter the directional light emitted from the LED chip, preferably with a negligible amount of absorption.

Figure 4:
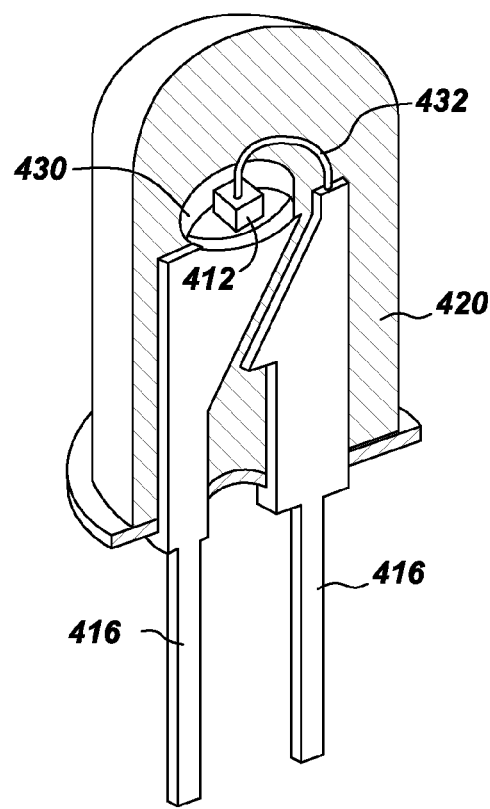
FIG. 4 is a cutaway side perspective view of a lighting apparatus in accordance with one embodiment of the invention.

As shown in a fourth structure in FIG. 4, the LED chip 412 may be mounted in a reflective cup 430. The cup 430 may be made from or coated with a dielectric material, such as alumina, titania, or other dielectric powders known in the art, or be coated by a reflective metal, such as aluminum or silver. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
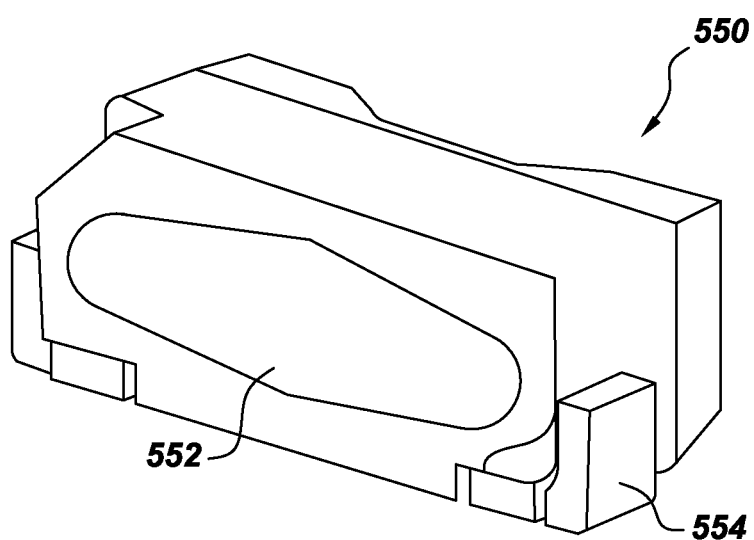
FIG. 5 is a schematic perspective view of a surface-mounted device (SMD) backlight LED.

Another structure (particularly for backlight applications) is a surface mounted device ("SMD") type light emitting diode 550, e.g. as illustrated in FIG. 5. This SMD is a "side-emitting type" and has a light-emitting window 552 on a protruding portion of a light guiding member 554. An SMD package may comprise an LED chip as defined above, and a phosphor material that is excited by the light emitted from the LED chip. Other backlight devices include, but are not limited to, TVs, computers, smartphones, tablet computers and other handheld devices that have a display including a semiconductor light source; and a color stable Me doped phosphor according to the present invention.

When used with an LED emitting at from 350 to 550 nm and one or more other appropriate phosphors, the resulting lighting system will produce a light having a white color. Lamp 10 may also include scattering particles (not shown), which are embedded in the encapsulant material. The scattering particles may comprise, for example, alumina or titania. The scattering particles effectively scatter the directional light emitted from the LED chip, preferably with a negligible amount of absorption.

In addition to the color stable $Mn^{4+}$ doped phosphor, phosphor composition 22 may include one or more other phosphors. When used in a lighting apparatus in combination with a blue or near UV LED emitting radiation in the range of about 250 to 550 nm, the resultant light emitted by the assembly will be a white light. Other phosphors such as green, blue, yellow, red, orange, or other color phosphors may be used in the blend to customize the white color of the resulting light and produce specific spectral power distributions. Other materials suitable for use in phosphor compostion 22 include electroluminescent polymers such as polyfluorenes, preferably poly(9,9-dioctyl fluorene) and copolymers thereof, such as poly(9,9'-dioctylfluorene-co-bis-N,N'-(4-butylphenyl) diphenylamine) (F8-TFB); poly(vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine)iridium (green dye) and Iridium (III) bis(2-(4,6-difluorephenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

Suitable phosphors for use in phosphor composition 22 include, but are not limited to: $((Sr_{1-z}(Ca, Ba, Mg, Zn)_z)_{1-(x+w)}(Li, Na, K, Rb)_w Ce_x)_3(Al_{1-y}Si_y)O_{4+y+3(x-w)}F_{1-y-3(x-w)}$, $0<x\leq0.10$, $0\leq y\leq0.5$, $0\leq z\leq0.5$, $0\leq w\leq x$; $(Ca,Ce)_3Sc_2Si_3O_{12}(CaSiG)$; $(Sr,Ca,Ba)_3Al_{1-x}Si_xO_{4+x}F_{1-x}:Ce^{3+}$ (SASOF)); $(Ba,Sr,Ca)_5(PO_4)_3(Cl,F,Br,OH):Eu^{2+},Mn^{2+}$; $(Ba,Sr,Ca)BPO_5:Eu^{2+},Mn^{2+}$; $(Sr,Ca)_{10}(PO_4)_6*vB_2O_3:Eu^{2+}$ (wherein $0<v\leq1$); $Sr_2Si_3O_8*2SrCl_2:Eu^{2+}$; $(Ca,Sr,Ba)_3MgSi_2O_8:Eu^{2+},Mn^{2+}$; $BaAl_8O_{13}:Eu^{2+}$; $2SrO*0.84P_2O_5*0.16B_2O_3:Eu^{2+}$; $(Ba,Sr,Ca)MgAl_{10}O_{17}:Eu^{2+},Mn^{2+}$; $(Ba,Sr,Ca)Al_2O_4:Eu^{2+}$; $(Y,Gd,Lu,Sc,La)BO_3:Ce^{3+},Tb^{3+}$; $ZnS:Cu^+,Cl^-$; $ZnS:Cu^+,Al^{3+}$; $ZnS:Ag^+,Cl^-$; $ZnS:Ag^+,Al^{3+}$; $(Ba,Sr,Ca)_2Si_{1-\xi}:Eu^{2+}$ (wherein $0\leq\xi\leq0.2$); $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_{5-\alpha}O_{12-3/2\alpha}:Ce^{3+}$ (wherein $0\leq\alpha\leq0.5$); $(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Sr,Ca,Ba,Mg,Zn)_2P_2O_7:Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+},Ce^{3+}$; $SrY_2S_4:Eu^{2+}$; $CaLa_2S_4:Ce^{3+}$; $(Ba,Sr,Ca)MgP_2O_7:Eu^{2+},Mn^{2+}$; $(Y,Lu)_2WO_6:Eu^{3+},Mo^{6+}$; $(Ba,Sr,Ca)_\beta Si_\gamma N_\mu :Eu^{2+}$ (wherein $2\beta+4\gamma=3\mu$); $Ca_3(SiO_4)Cl_2:Eu^{2+}$; $(Lu,Sc,Y,Tb)_{2-u-v}Ce_v Ca_{1+u}Li_w Mg_{2-w}P_w(Si,Ge)_{3-w}O_{12-u/2}$ (where $-0.5\leq u\leq1$, $0<v\leq0.1$, and $0\leq w\leq0.2$); $(Y,Lu,Gd)_{2-o}Ca_\phi Si_4 N_{6+\phi}:Ce^{3+}$, (wherein $0\leq\phi\leq0.5$); $(Lu,Ca,Li,Mg,Y)$, α-SiAlON doped with $Eu^{2+}$ and/or $Ce^{3+}$; $(Ca,Sr,Ba)SiO_2N_2:Eu^{2+}$, $Ce^{3+}$; β-SiAlON:$Eu^{2+}$, $3.5MgO*0.5MgF_2*GeO_2:Mn^{4+}$; $Ca_{1-c-f}Ce_c Eu_f Al_{1+c}Si_{1-c}N_3$, (where $0\leq c\leq0.2$, $0\leq f\leq0.2$); $Ca_{1-h-r}Ce_h Eu_r Al_{1-h}(Mg,Zn)_h SiN_3$, (where $0\leq h\leq0.2$, $0\leq r\leq0.2$); $Ca_{1-2s-t}Ce_s(Li,Na)_s Eu_t AlSiN_3$, (where $0\leq s\leq0.2$, $0\leq f\leq0.2$, $s+t>0$); and $Ca_{1-\sigma-\chi-\phi}Ce_\sigma(Li,Na)_\chi Eu_\phi Al_{1+\sigma+\chi}Si_{1-\sigma+\chi}N_3$, (where $0\leq\sigma\leq0.2$, $0\leq\chi\leq0.4$, $0\leq\phi\leq0.2$).

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. As stated, white light is preferably produced. This white light may, for instance, may possess an x value in the range of about 0.20 to about 0.55, and a y value in the range of about 0.20 to about 0.55. As stated, however, the exact identity and amounts of each phosphor in the phosphor composition can be varied according to the needs of the end user. For example, the material can be used for LEDs intended for liquid crystal display (LCD) backlighting. In this application, the LED color point would be appropriately tuned based upon the desired white, red, green, and blue colors after passing through an LCD/color filter combination.

LED devices incorporating the color stable phosphors and used for backlighting or general illumination lighting may have a color shift of <1.5 MacAdam ellipses over 2,000 hours of device operation, and, in particular embodiments, <1 MacAdam ellipse over 2,000 hours, where the phosphor/polymer composite is in direct contact with the LED chip surface, LED wall plug efficiency greater than 40%, and LED current densities are greater than 2 $A/cm^2$. In accelerated testing, where the phosphor/polymer composite is in direct contact with the LED chip surface, LED wall plug efficiency greater than 18%, and LED current densities are greater than 70 $A/cm^2$, LED devices may have color shift of <1.5 MacAdam ellipse over 30 minutes.

The color stable $Mn^{4+}$ doped phosphors of the present invention may be used in applications other than those described above. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are merely exemplary and not limiting.

EXAMPLES

General Procedures

Silicone Tape Sample Preparation

Samples were prepared by mixing 500 mg of the material to be tested with 1.50 g silicone (Sylgard 184). The mixture was degassed in a vacuum chamber for about 15 minutes. The mixture (0.70 g) was poured into a disc-shaped template (28.7 mm diameter and 0.79 mm thick) and baked for 30 minutes at 90° C. The sample was cut into squares of size approximately 5 mm×5 mm for testing.

Stability Testing

High Light Flux Conditions

A laser diode emitting at 446 nm was coupled to an optical fiber with a collimator at its other end. The power output was 310 mW and the beam diameter at the sample was 700 microns. This is equivalent to a flux of 80 W/cm$^2$ on the sample surface. The spectral power distribution (SPD) spectrum that is a combination of the scattered radiation from the laser and the emission from the excited phosphor is collected with a 1 meter (diameter) integrating sphere and the data processed with the spectrometer software (Specwin). At intervals of two minutes, the integrated power from the laser and the phosphor emission were recorded over a period of about 21 hours by integrating the SPD from 400 nm to 500 nm and 550 nm to 700 nm respectively. The first 90 minutes of the measurement are discarded to avoid effects due to the thermal stabilization of the laser. The percentage of intensity loss due to laser damage is calculated as follows:

$$\text{Intensity loss } (\%) = 100 \frac{(\text{Power} - \text{Initial power})}{\text{Initial power}}$$

While only the emitter power from the phosphor is plotted, the integrated power from the laser emission as well as its peak position was monitored to ensure that the laser remained stable (variations of less than 1%) during the experiment.

High Temperature High Humidity (HHTH) Treatment

Samples for high temperature, high humidity (HTHH) treatment were made by mixing phosphor powders into a two-part methyl silicone binder (RTV-615, Momentive Performance Materials) in a ratio of 0.9 g phosphor to 0.825 g silicone (parts A+B). The phosphor/silicone mixture is then poured into aluminum sample holders and cured at 90° C. for 20 minutes. Control samples were stored under nitrogen, and samples for exposure to HTHH conditions were placed into a 85° C./85% RH controlled atmosphere chamber. These HTHH samples are periodically removed and their luminescence intensity under 450 nm excitation compared to that of the control samples.

Examples 1-12

Annealing Under Fluorine Atmosphere

Procedure

A Mn-doped potassium fluorosilicate (PFS:Mn) precursor, $K_2SiF_6$:Mn, containing 0.68 wt % Mn, based on total weight of the precursor material was placed in a furnace chamber. The furnace chamber was evacuated and was filled with an atmosphere containing fluorine gas and nitrogen gas. The chamber was then heated to the desired anneal temperature. After holding for the desired amount of time, the chamber was cooled to room temperature. The fluorine nitrogen mixture was evacuated, the chamber was filled and purged several times with nitrogen to ensure the complete removal of fluorine gas before opening the chamber.

For Examples 1-5, the atmosphere in the chamber was composed of 20% fluorine gas and 80% nitrogen gas. For Example 6, the atmosphere was composed of 5% fluorine gas and 95% nitrogen gas. Furnace setpoint temperature and time for a first annealing period (T1 and t1) and furnace setpoint temperature and time for a second annealing period, if any, (T2 and t2) are indicated in Table 1. Due to the furnace setup and how the sample is placed relative to the control thermocouples in the furnace actual sample temperatures in the furnace were 25-75° C. higher than the furnace setpoint.

The stability of precursor PFS:Mn having wt % Mn ranging from 0.68-0.73 wt % and the product phosphor (Comparative Example 1) was tested under conditions of high light flux, and results are shown in Table 1. The annealed materials experienced significantly less damage than the materials that were not heat treated.

TABLE 1

| Example No. | T1 (° C.) | t1 (hr.) | T2 (° C.) | t2 (hr.) | Laser Damage | Comments |
|---|---|---|---|---|---|---|
| Comp. Ex. 1 | — | — | — | — | 6%-9% | No heat treatment |
| 1 | 225 | 4 | — | — | 3.8% | |
| 2 | 225 | 4 | 350 | 4 | 1.8% | Post-treatment |
| 3 | 300 | 4 | 425 | 4 | 0.8% | |
| 4 | 350 | 4 | — | — | 2.7% | |
| 5 | 425 | 4 | — | — | 1.1% | |
| 6 | 225 | 4 | 350 | 4 | 2.5% | 5% $F_2$ and 95% $N_2$ |

Example 2

Post-Treatment of Annealed Phosphor

The annealed PFS phosphor powder from Example 2 was treated with a saturated solution of $K_2SiF_6$ by placing the powder (~10 g) in a Teflon beaker containing 100 mL of a saturated solution of $K_2SiF_6$ (initially made by adding ~17 g of $K_2SiF_6$ in 40% HF at room temperature, stirring, and filtering the solution). The suspension was stirred slowly, and the residue is filtered and dried under vacuum. Further removal of HF from the dried filtrate was done by washing in acetone 3-5 times and heating the filtrate to 100° C. for 10 min. Stability of the post-treated phosphor along with a sample of PFS that was not annealed but was post treated was evaluated under HHTH conditions, at 85° C./85% RH for 620 hours. The post-treated sample experienced less degradation under the high temperature/humidity conditions, maintaining about 94% emission intensity, while the non-annealed sample maintained about 86% emission intensity.

Comparative Examples 2-7

Samples of unannealed and untreated PFS precursors having Mn content ranging from 0.5-0.85 wt % were tested under conditions of high light flux as shown in Table 2.

Examples 7-12

Samples of the PFS precursors were annealed at furnace setpoint temperatures ranging from 425-550° C. for times ranging from 4-8 hours as shown in Table 2. After annealing, all samples were treated in saturated $K_2SiF_6$ solutions in 48% HF as in Example 2. The annealed phosphors were tested under conditions of high light flux, and results are shown in Table 2.

TABLE 2

| Example no. | Mn level (wt %) | Furnace setpoint T, ° C. | Time | Laser damage/% intensity loss |
|---|---|---|---|---|
| Comp. Ex. 2 | 0.74% | N/A | | 6.9% |
| 7 | | 500 | 8 hours | 1.5% |
| Comp. Ex. 3 | 0.84% | N/A | | 10.9% |
| 8 | | 500 | 8 hours | 2.3% |
| Comp. Ex. 4 | 0.68% | N/A | | 7.1% |
| 9 | | 475 | 8 hours | 1.0% |
| Comp. Ex. 5 | 0.73% | N/A | | 8.4% |
| 10 | | 500 | 8 hours | 1.25% |
| Comp. Ex. 6 | 0.71% | N/A | | 9.9% |
| 11 | | 475 | 8 hours | 1.1% |
| Comp. Ex. 7 | 0.53% | N/A | | 3.3% |
| 12 | | 425 | 4 hours | 0.6% |

Example 13

Diluted PFS Silicone Tape

Unannealed $K_2SiF_6$:Mn (0.68 wt % Mn) was mixed with a silicone precursor and formed into a solid tape composed of 87.8 volume % silicone and 12.2 volume % PFS. A control contained a 1:1 mixture of $K_2SiF_6$:Mn (0.68 wt % Mn) (doped PFS) and $K_2SiF_6$ (0 wt % Mn) (undoped PFS), having a final composition of 75.6 vol % silicone, 12.2% undoped PFS and 12.2 vol % doped PFS.

The tape was subjected to stability testing under high light flux conditions. Power intensity loss for the diluted PFS sample was about 2.5% after 24 hours, and was significantly lower than that of the control.

Example 14

Reduced Mn Level

A Mn-doped potassium fluorosilicate (PFS:Mn) precursor, $K_2SiF_6$:Mn, containing 0.53 wt % Mn, based on total weight of the precursor material was tested under conditions of high light flux, and results are shown in Table 3. The material containing the lower Mn level experienced significantly less damage than the control that was not heat treated (Comparative Example 8).

TABLE 3

| Example | Laser Damage | % Mn | Comments |
|---|---|---|---|
| Comp. Ex. 8 | 6%-9% | 0.68-0.73 | Not annealed |
| 14 | 3.4% | 0.53 | $Mn^{4+}$ reduced by 25% |

Example 15

Higher Annealing Temperatures in an Alternate Furnace

A Mn-doped potassium fluorosilicate (PFS:Mn) precursor, $K_2SiF_6$:Mn, containing 0.84 wt % Mn, based on total weight of the precursor material was annealed under the conditions shown in Table 4 in a different furnace whose setpoint temperatures were closer to the maximum temperature in the furnace. After the annealing step, the materials were processed using the post-treatment process in Example 2. The phosphor and an annealed, untreated sample (Comparative Example 9) were tested under conditions of high light flux.

Results are shown in Table 4. The annealed and post-treated material experienced significantly less damage than the control that was not heat treated. In addition, the phosphor quantum efficiency under blue LED excitation was higher by ~7.5% versus the initial control sample.

TABLE 4

| Example | Laser Damage | Relative quantum efficiency | % Mn | Conditions |
|---|---|---|---|---|
| Comp. Ex. 9 | 10.9% | 100 | 0.84% | Not annealed |
| 15 | 1.5% | 107.5 | 0.82% | 540° C. in 10 psia of 20% $F_2$/80% $N_2$ for 8 hours |

Examples 16 and 17

LED Packaging and Testing Procedure

LED packages were made using $K_2SiF_6$:$Mn^{4+}$ phosphors that were annealed using the conditions in examples 2 (Example 16) and 5 (Example 17) as well as unannealed $K_2SiF_6$:$Mn^{4+}$ phosphors (Comparative Examples 10 and 11). These phosphors were blended with $Ce^{3+}$-doped garnets and a silicone binder and deposited within a package similar to typical 3030 LED package with two blue emitting LED chips for a color temperature of ~4000K. The packages were then attached to a printed circuit board. The LED dimensions in these packages were approximately 0.65 mm×0.65 mm; taking this LED area, the LED current density is defined as:

LED current density=Drive current/[(LED area)* (number of LEDs in package)]

The devices of Comparative Example 10 and Example 16 were operated at 30 mA, at ambient temperature ($T_{ambient}$) of 47° C. for 4000 hours. The devices of Comparative Example 11 and Example 17 were operated at 700 mA drive current at a board temperature ($T_{board}$) of 60° C. for 30 minutes. Using the above formula, a 30 mA drive current gives a LED current density of approximately 3.6 A/cm$^2$, and a 700 mA drive current gives a LED current density of approximately 83 A/cm$^2$. Similar LED packages without phosphors give a wall-plug efficiency (defined by emitted optical power divided by input electrical power) of 54% at 100 mA drive current and board temperature of 60° C. and 22% at 700 mA drive current and board temperature of 60° C. The device color point was obtained by measuring the spectral power distribution of the LED device using a calibrated integrating sphere spectrometer at different times after LED operation under different drive current and ambient/board temperature conditions. Results are shown in Tables 5 and 6.

TABLE 5

| Example no. | MacAdam steps after 4000 hours | Dx after 4000 hours | Dy after 4000 hours | D [intensity@631 nm] after 4000 hours |
|---|---|---|---|---|
| Comp. Ex. 10 | 1.82 | 0.0023 | 0.0010 | 91.7% |
| 16 | 0.91 | 0.0004 | 0.0000 | 93.5% |

TABLE 6

| Example no. | MacAdam steps after 30 min | Dx after 30 min | Dy after 30 min | D [I(631 nm)/ I(455 nm)] after 30 min |
|---|---|---|---|---|
| Comp. Ex. 11 | 4.0 | −0.0058 | −0.0012 | −10.5% |
| 17 | 0.5 | −0.0011 | −0.0009 | −1.3% |

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A process for synthesizing a color stable $Mn^{4+}$ doped phosphor, the process comprising contacting a precursor of formula I, $$A_x[MF_y]:Mn^{4+} \qquad \text{I}$$

at an elevated temperature with a fluorine-containing oxidizing agent in gaseous form to form the color stable Me doped phosphor;
wherein
A is Li, Na, K, Rb, Cs, or a combination thereof;
M is Si, Ge, Sn, Ti, Zr, Al, Ga, In, Sc, Hf, Y, La, Nb, Ta, Bi, Gd, or a combination thereof;
x is the absolute value of the charge of the $[MF_y]$ ion; and
y is 5, 6 or 7.

2. A process according to claim 1, wherein the fluorine-containing oxidizing agent is $F_2$, anhydrous HF, $BrF_5$, $NH_4HF_2$, $NH_4F$, $AlF_3$, $SF_6$, $SbF_5$, $ClF_3$, $BrF_3$, KrF, $XeF_2$, $XeF_4$, $NF_3$, $PbF_2$, $ZnF_2$, $SiF_4$, $SnF_2$, $CdF_2$ or a combination thereof.

3. A process according to claim 1, wherein the fluorine-containing oxidizing agent is $F_2$.

4. A process according to claim 1, wherein the temperature is at least 100° C.

5. A process according to claim 1, wherein the temperature is at least 350° C.

6. A process according to claim 1, wherein the temperature is at least 225° C.

7. A process according to claim 1, wherein the temperature is any temperature in a range from about 200° C. to about 700° C.

8. A process according to claim 1, wherein the temperature is any temperature in a range from about 350° C. to about 600° C.

9. A process according to claim 1, wherein the phosphor precursor is contacted with the reactant for a period of at least one hour.

10. A process according to claim 1, wherein the phosphor precursor is contacted with the reactant for a period of at least four hours.

11. A process according to claim 1, wherein the phosphor precursor is contacted with the reactant for a period of least about six hours.

12. A process according to claim 1, wherein the phosphor precursor is contacted with the reactant for a period of about eight hours.

13. A process according to claim 1, wherein the phosphor precursor is contacted with the reactant for a period of at least eight hours and a temperature of at least 250° C.

14. A process according to claim 1, wherein the temperature is initially about 250° C. for about four hours and then about 350° C. for about four hours.

15. A process according to claim 1, wherein the atmosphere comprises at least 0.5% fluorine.

16. A process according to claim 1, wherein the atmosphere comprises at least 5% fluorine.

17. A process according to claim 1, wherein the atmosphere comprises at least 20% fluorine.

18. A process according to claim 1, wherein the atmosphere additionally comprises nitrogen, helium, neon, argon, krypton, xenon, or a combination thereof.

19. A process according to claim 1, wherein the atmosphere comprises about 20% fluorine and about 80% nitrogen.

20. A process according to claim 1, wherein M is Si, Ge, Sn, Ti, Zr, or a combination thereof.

21. A process according to claim 1, wherein
A is Na, K, Rb, Cs, or a combination thereof;
M is Si, Ge, Ti, or a combination thereof; and
Y is 6.

22. A process according to claim 1, wherein the phosphor precursor is $K_2SiF_6:Mn^{4+}$.

23. A process according to claim 1, additionally comprising contacting the color stable $Mn^{4+}$ doped phosphor in particulate form with a saturated solution of a composition of formula II in aqueous hydrofluoric acid, $$A_x[MF_y]; \qquad \text{II.}$$

24. A color stable $Mn^{4+}$ doped phosphor prepared by a process according to claim 1.

25. A lighting apparatus comprising a semiconductor light source; and color stable $Mn^{4+}$ doped phosphor prepared by a process according to claim 1.

26. A lighting apparatus according to claim 25, having a color shift of ≤1.5 MacAdam ellipses after operating for at least 2,000 hour at a LED current density greater than 2 A/cm², a LED wall-plug efficiency greater than 40%, and a board temperature greater than 25° C.

27. A lighting apparatus according to claim 26, wherein the MacAdam ellipse color shift is ≤1.

28. A lighting apparatus according to claim 26, having a color shift of ≤2 MacAdam ellipses after operating for 30 minutes at a LED current density greater than 70 A/cm², a LED wall-plug efficiency greater than 18%, and a board temperature greater than 25° C.

29. A backlight device comprising a semiconductor light source; and a color stable $Mn^{4+}$ doped phosphor prepared by a process according to claim 1.

* * * * *

UNITED STATES PATENT AND TRADEMARK OFFICE
CERTIFICATE OF CORRECTION

PATENT NO. : 8,906,724 B2
APPLICATION NO. : 14/311624
DATED : December 9, 2014
INVENTOR(S) : Murphy et al.

It is certified that error appears in the above-identified patent and that said Letters Patent is hereby corrected as shown below:

In the specification

In Column 7, Line 13, delete "Me" and insert -- $Mn^{4+}$ --, therefor.

In Column 7, Line 65, delete "$(Ba,Sr,Ca)_2Si_{1-\xi}:Eu^{2+}$" and insert -- $(Ba,Sr,Ca)_2Si_{1-\xi}O_{4-2\xi}:Eu^{2+}$ --, therefor.

In Column 8, Line 7, delete "$2\beta3+4\gamma=3\mu$);" and insert -- $2\beta+4\gamma=3\mu$); --, therefor.

In Column 8, Lines 9-10, delete "$(Y,Lu,Gd)_{2-\varphi}Ca_\varphi Si_4 N_{6+\varphi}:Ce^{3+}$," and insert -- $(Y,Lu,Gd)_{2-\varphi}Ca_\varphi Si_4 N_{6+\varphi}C_{1-\varphi}:Ce^{3+}$, --, therefor.

In the claims

In Column 13, Line 22, in Claim 1, delete "Me" and insert -- $Mn^{4+}$ --, therefor.

Signed and Sealed this
Thirteenth Day of October, 2015

Michelle K. Lee
*Director of the United States Patent and Trademark Office*